United States Patent
Lippitt, III et al.

(10) Patent No.: US 7,033,931 B2
(45) Date of Patent: Apr. 25, 2006

(54) TEMPERATURE OPTIMIZATION OF A PHYSICAL VAPOR DEPOSITION PROCESS TO PREVENT EXTRUSION INTO OPENINGS

(75) Inventors: Maxwell W. Lippitt, III, Rockwall, TX (US); Craig G. Clabough, Cocoa Beach, FL (US); Joseph W. Buckfeller, Windermere, FL (US); Timothy J. Daniel, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/633,334

(22) Filed: Aug. 1, 2003

(65) Prior Publication Data

US 2005/0023133 A1     Feb. 3, 2005

(51) Int. Cl.
    *H01L 21/44*     (2006.01)
(52) U.S. Cl. .................. 438/654; 438/656; 438/675; 438/676

(58) Field of Classification Search ............. 438/654, 438/656, 675, 676; 204/192.1, 192.17
See application file for complete search history.

(56) References Cited

U.S. PATENT DOCUMENTS

| | | | |
|---|---|---|---|
| 6,193,855 B1 * | 2/2001 | Gopalraja et al. | 204/192.12 |
| 6,660,622 B1 * | 12/2003 | Chen et al. | 438/595 |
| 6,720,261 B1 * | 4/2004 | Anderson et al. | 438/687 |

OTHER PUBLICATIONS

Periodic Table of the Elements, Sargent-Welch Scientific Company, 1979.*

* cited by examiner

*Primary Examiner*—William M. Brewster

(57) ABSTRACT

A physical vapor deposition process for maintaining the wafer below a critical temperature. The rate at which material particles are sputtered from the target and thus deposited on the wafer is controllable in response to power supplied to the target. Maintaining a desired deposition rate maintains the wafer temperature below the critical temperature.

30 Claims, 16 Drawing Sheets

TEMPERATURE OPTIMIZATION OF A PHYSICAL VAPOR DEPOSITION PROCESS TO PREVENT EXTRUSION INTO OPENINGS

FIELD OF THE INVENTION

The present invention relates generally to physical vapor deposition processes for use in the fabrication of integrated circuits, and more specifically to temperature optimized physical vapor deposition processes.

BACKGROUND OF THE INVENTION

Integrated circuit devices (or chips) typically comprise a silicon substrate and semiconductor elements, such as transistors, formed from doped regions within the substrate. Interconnect structures, formed in parallel layers overlying the semiconductor substrate, provide electrical connection between elements to form electrical circuits. Typically, several (e.g., 6–9) interconnect layers (referred to as "M" layers or metallization layers) are required to interconnect the doped regions and elements of the integrated circuit device. The process of forming the interconnects between devices is referred to as metallization and is performed using a number of photolithographic, etching and deposition techniques. Generally, the interconnect structures comprise a plurality of stacked conductive layers substantially parallel to the upper surface of the substrate and vertical conductive plugs that interconnect the stacked conductive layers. The top metallization layer provides attachment points for conductive interconnects (e.g., bond wires) for connecting the device to pins or leads of a package structure.

An exemplary semiconductor structure and the associated metallization or interconnect layers are illustrated beginning in a FIG. 1 cross-section, where an n-type MOSFET 8 is formed within a silicon substrate 10, comprising a p-type well 11, lightly doped (n−) source/drain regions 12/14, source/drain regions (n+) 16/18, and a polysilicon gate 20 formed over a gate oxide 22. Oxide spacers 24 are formed on the sides of the polysilicon gate 20. Silicon dioxide isolation regions 32 isolate adjacent devices formed within the silicon substrate 10.

An intermetal dielectric layer 40 is formed over an upper surface 42 of the silicon substrate 10, followed by formation of windows 44 extending through the intermetal dielectric layer 40 to the device regions that are to be connected to other active regions formed in the substrate 10. The windows 44 are formed using known photolithographic masking, patterning and etching processes. Tungsten plugs, formed within the windows 44 as described below, interconnect the device regions to an overlying interconnect layer formed later overlying the upper surface of the intermetal dielectric layer 40.

As illustrated in FIG. 2, a titanium layer 50 is deposited in the windows 44 and a field region 52, i.e., the upper surface of the intermetal dielectric layer 40. Within the windows 44, the titanium layer 50 reacts with the underlying silicon (of the source/drain regions 12/14 and the polysilicon gate 20) to form a localized titanium silicide region within the silicon. This silicide region provides improved conductivity between the active region of the device and the tungsten plugs that are formed later in the windows 44.

According to one embodiment, the titanium layer is about 500 Angstroms thick in the field region 52, with about 50% step coverage along a bottom surface 54 of the windows 44, and about 10% step coverage on sidewalls 56 of the windows 44. Step coverage is a measure of the material thickness as a percent of the thickness in the field region 52. Thus the titanium thickness along the bottom surface is about 250 Angstroms, and the thickness along the sidewalls 56 is about 50 Angstroms. When used for the upper level metallization layers the titanium layer is only about 300 Angstroms thick as there is no underlying silicon layer with which to form a silicide region.

During the semiconductor fabrication process it is sometimes advantageous to include an adhesion layer between two dissimilar material layers that may not adequately adhere to each other. This adhesion or "glue" layer promotes layer bonding by forming an intermetallic bond with the underlying and overlying layers. Thus the titanium layer 50 also serves as an adhesion layer for a titanium-nitride layer formed thereover according to the next process step described below.

Next a titanium-nitride (TiN) layer 58 is deposited. The TiN layer serves as a barrier between the underlying titanium layer and the fluorine-based gas used for depositing the tungsten as described below, as the fluorine-based gas is highly reactive with titanium. In one embodiment the titanium-nitride layer 58 is about 400 Angstroms thick in the field region 52, with about 50% step coverage on the bottom surface 54 and about 10% step coverage on the sidewalls 56.

It is known that titanium-nitride can delaminate from oxide-based materials such as the intermetal dielectric layer 40. Thus use of the titanium layer 50 is advantageous to promote adhesion between the titanium-nitride layer 58 and the underlying dielectric material of the field region 52 and of the sidewalls 56.

During the semiconductor fabrication process it is advantageous to perform consecutive processing steps within the same process tool to avoid exposing the wafer to ambient contaminants and moisture. Thus according to conventional processing, the titanium and the titanium-nitride of the titanium layer 50 and the titanium nitride layer 58 are deposited in different chambers of the same physical vapor deposition (PVD) (also referred to a sputtering) process tool.

As shown in FIG. 3, a tungsten layer 60 is formed in the windows 44 and in the field region 52 by a chemical vapor deposition process involving tungsten hexafluoride ($WF_6$) and silane ($SiH_4$). The silicon substrate 10 then undergoes a chemical-mechanical polishing step, leaving tungsten plugs 62 within the windows 44. See FIG. 4.

According to FIG. 5, an aluminum stack 66 (also referred to as the first metallization layer or M1) comprising, from bottom to top, a titanium layer, a titanium nitride layer, an aluminum layer and an anti-reflective cap layer, is deposited over the field region 52. The individual layers of the aluminum stack 66 are not shown in FIG. 5. The titanium and the titanium-nitride layers of the aluminum stack 66 serve the same purposes as the titanium and titanium nitride layers 50 and 58 as described above, but are typically thinner because there is no silicide region formed with the titanium layer, as there is no underlying silicon at this level.

Certain regions of the aluminum stack 66 are removed using conventional masking, patterning and etching steps, leaving the desired first level interconnect structure, comprising regions 66A, 66B and 66C, in the pattern required for interconnecting the device regions formed in the silicon substrate 10. See FIG. 6.

Also as shown in FIG. 6, an intermetal dielectric layer 70 is formed over the first level metallization layer 66 to insulate the latter from an overlying second level interconnect structure to be subsequently formed. Before the second level interconnect is formed, a chemical/mechanical polishing process is performed to planarize an upper surface 72 of the intermetal dielectric layer 70. The resulting structure is illustrated in FIG. 7.

As shown in FIG. 8, via openings 76 are formed in the intermetal dielectric layer 70 using conventional photolithographic patterning, masking and etching steps. Tungsten plugs 80A and 80B, shown in FIG. 9, are formed in the via openings 76 to electrically contact regions of the underlying first metallization level 66. Specifically, the tungsten plug 80A contacts the interconnect segment 66B and the tungsten plug 80B contacts the interconnect segment 66C. The tungsten plugs 62A and 62B are conventionally formed by chemical-vapor deposition during which tungsten is also deposited on the upper surface or field region 72. Like the tungsten plugs 62 in the first metallization layer 66, the tungsten plugs 80A and 80B include titanium and titanium nitride layers serving the same purpose as the titanium layer 50 and the titanium nitride layer 58 as described above. In addition, the titanium layer promotes bonding of the titanium-nitride layer to the underlying aluminum of the first metallization layer 66.

The substrate 10 undergoes a chemical/mechanical polishing step to remove the tungsten overfill and replanarize the upper surface 72, leaving only the tungsten plugs 80A and 80B. FIG. 9 illustrates the configuration of the substrate 10 following the chemical/mechanical polishing replanarization.

Next an aluminum stack for the second metallization layer (M2) is deposited on the upper surface 72 in electrical contact with the tungsten plugs 80A and 80B. The second metallization layer comprises, from bottom to top, a titanium layer, a titanium nitride layer, an aluminum layer and an anti-reflective cap layer. The individual layers of the aluminum stack 82 are not shown in FIG. 10. The titanium and the titanium-nitride layers serve the same purposes as the titanium and titanium nitride layers 50 and 58 described above, but are typically thinner because there is no silicide region formed with the titanium, as there is no underlying silicon at this level. The second metallization layer is patterned, masked and etched to form the required circuit interconnect structures, identified by reference characters 82A and 82B in FIG. 10.

The process of forming dielectric layers, conductive plugs (e.g., formed of tungsten) and overlying interconnect layers continues as required to implement the interconnections required for the operative integrated circuit device. A passivation layer (not shown) is formed over the final interconnect layer to protect the formed device.

As will be described further below, the various layers formed during the above-described metallization processes, in particular the titanium layers and the titanium-nitride layers, are conventionally formed by a physical vapor deposition process, a process known generally for depositing a material onto a substrate.

An exemplary simplified sputtering process chamber 100, illustrated in FIG. 11, encloses a target 102 formed of the material to be deposited on a wafer 106 positioned on a chuck 107 located near the bottom of the chamber 100. A DC power supply 110 maintains a negative bias on the target 102 with respect to a grounded chamber shielding 108. The chamber 100 is maintained at a vacuum during the sputtering process. Conventionally, argon molecules are introduced into the chamber 100 via an inlet 112 and ionized by the electric field between the target 102 and the chamber shield 108, producing a plasma of positively charged argon ions 116. The argon ions 116 gain momentum as they accelerate toward the negatively charged target 102.

A magnet 118 creates a magnetic field that generally confines the argon plasma to a region 119 where the increased plasma density improves the sputtering efficiency. As the argon ions 116 strike the target 102, the momentum of the ions is transferred to the atoms of the target material, sputtering or knocking the atoms from the target 102. A high density of argon ions 116 in the chamber 100 ensures that a significant number of sputtered atoms condense on the upper surface of the wafer 106. The target material is thus deposited on the wafer 106 without undergoing any chemical or compositional changes. The various sputtering chamber parameters, including chamber pressure, chamber and wafer temperature, deposition power (i.e., the power supplied to the target 102 by the power supply 110, where power is the product of voltage and current) can be varied to achieve the desired characteristics in the sputtered film. Layers of different materials can also be sputtered in a single process using multiple target arrangements.

Since the surface of the wafer 106 typically comprises various non-planar features (e.g., openings, windows, trenches), a deposition process for depositing a conformal layer on the surface and/or within the features must provide good deposition coverage or step coverage as defined above. Sputtering employs a planar source and thus material is sputtered from every point on the target 102, arriving at the wafer 106 over a wide angular range to provide a degree of conformal deposition over these various non-planar features. However, as device sizes shrink, the non-planar features also shrink and good conformal coverage is more difficult to achieve. Advanced sputtering techniques, including ion metal plasma sputtering (to be described below), have been introduced to provide the required conformal coverage.

It is known that the sputtering of material onto a wafer can raise the wafer temperature due to the friction created upon impact of the target atoms or molecules with the wafer. The heat can cause uneven film deposition on the wafer surface. Also, if the wafer temperature is sufficiently high, aluminum from metal interconnect layers can extrude through overlying via openings, especially during the process of depositing barrier layers in the via openings.

One known technique for limiting the wafer temperature and the aforementioned extrusion difficulties is to flow a coolant gas, such as argon or helium, along the wafer backside surface to thermally couple the wafer 106 to the chuck 107 and thus draw heat from the wafer 106 to the chuck 107. To maintain the wafer 106 in position against the force of the coolant gas, a ring-like clamp is positioned over the wafer. In lieu of the clamp, an electrostatic chuck can be employed to maintain the wafer position by an electrostatic force generated by an electric field formed between the wafer and the electrostatic chuck Generally, an electrostatic chuck is more expensive than a clamp-type chuck Also, high-voltage external power supplies are required to charge the wafer 106 and the electrostatic chuck to create the electrostatic forces.

BRIEF SUMMARY OF THE INVENTION

A method for depositing a target material on a semiconductor wafer, wherein the wafer comprises a first material layer, an overlying second material layer and a plurality of openings in the second material layer extending to the first material layer. Target material particles are sputtered from a target on the wafer. The power supplied to the to the target is controlled to maintain the wafer temperature below a critical temperature, wherein at a wafer temperature above the critical temperature the material of the first material layer can extrude into one or more of the plurality of openings.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Figure 1:
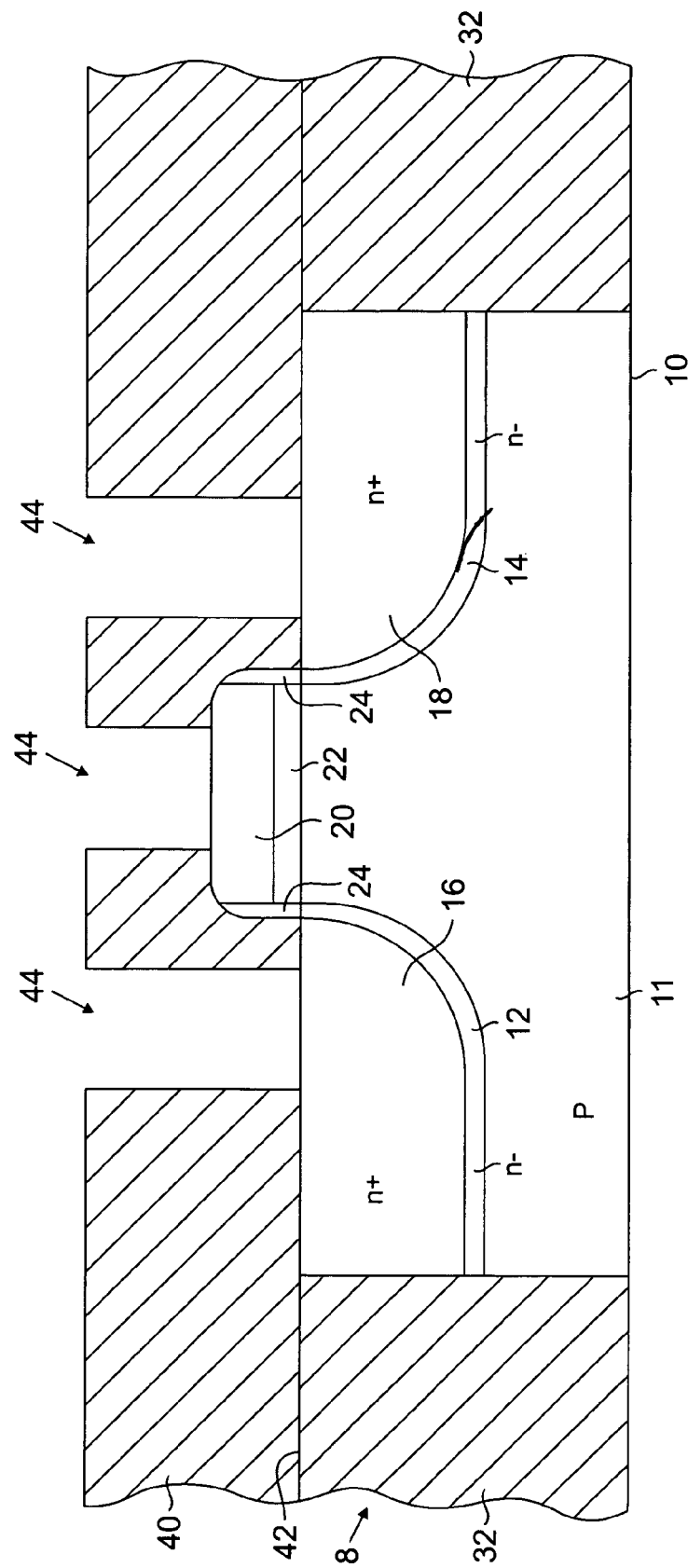
FIGS. 1 through 10 are cross-sectional views of a semiconductor substrate during various processing steps.
Figure 2:
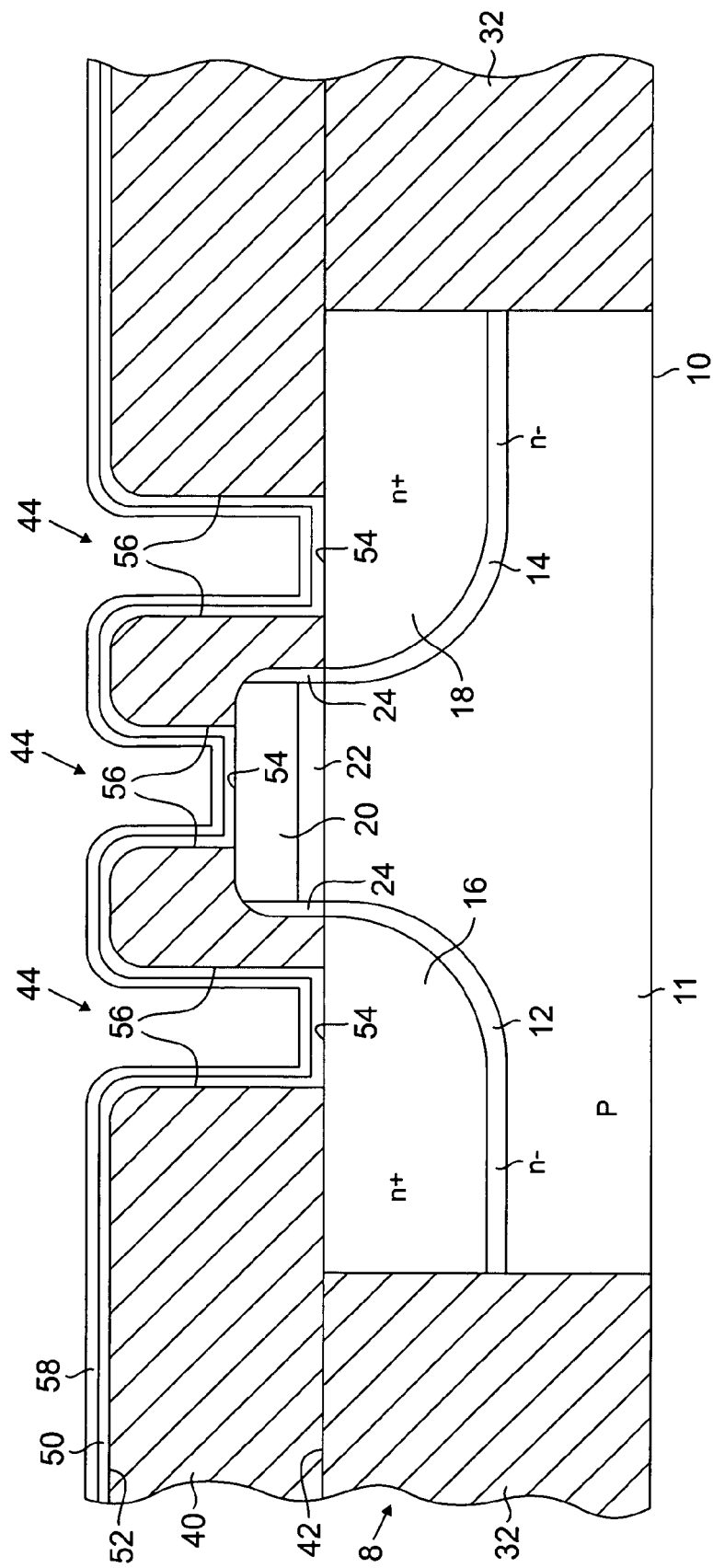
Figure 3:
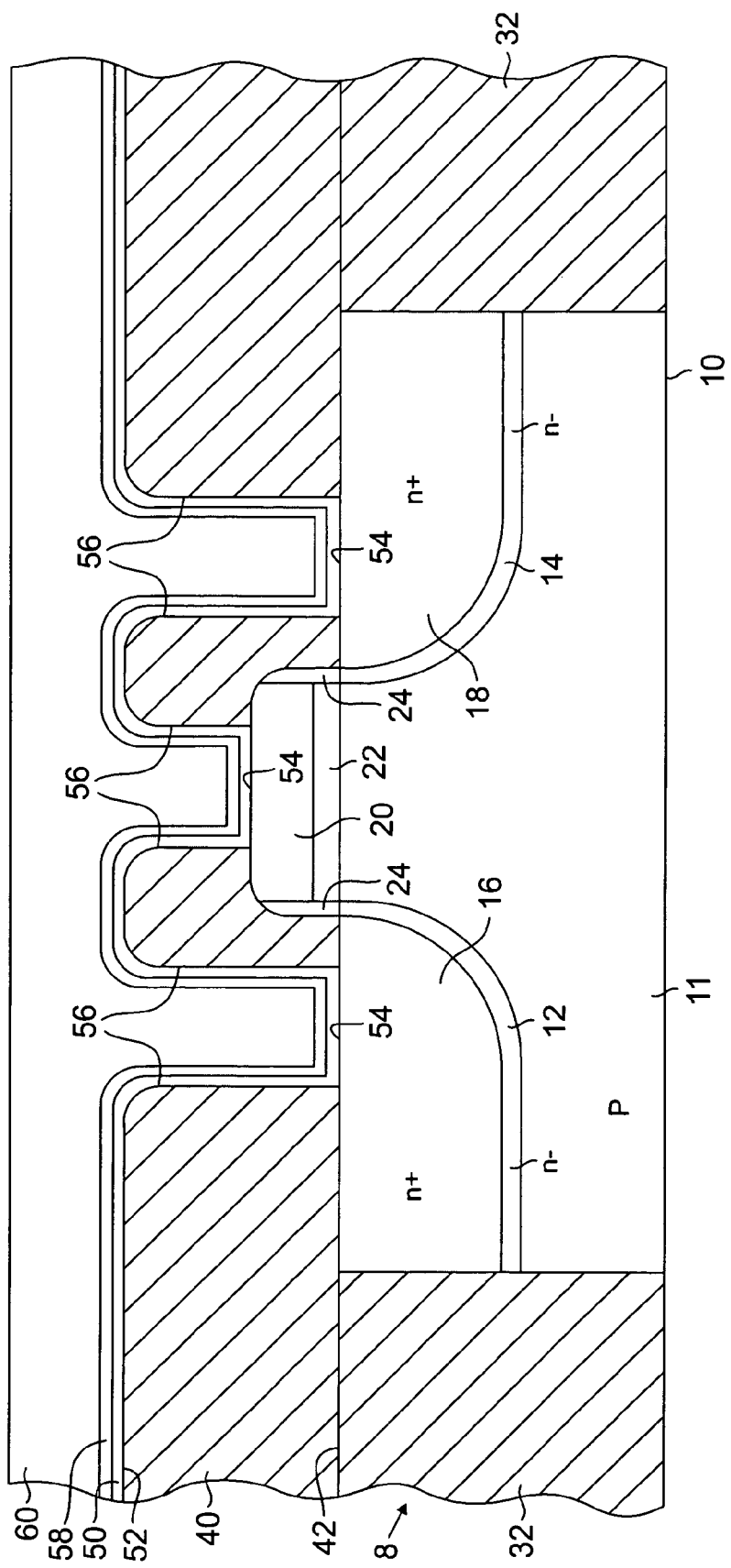
Figure 4:
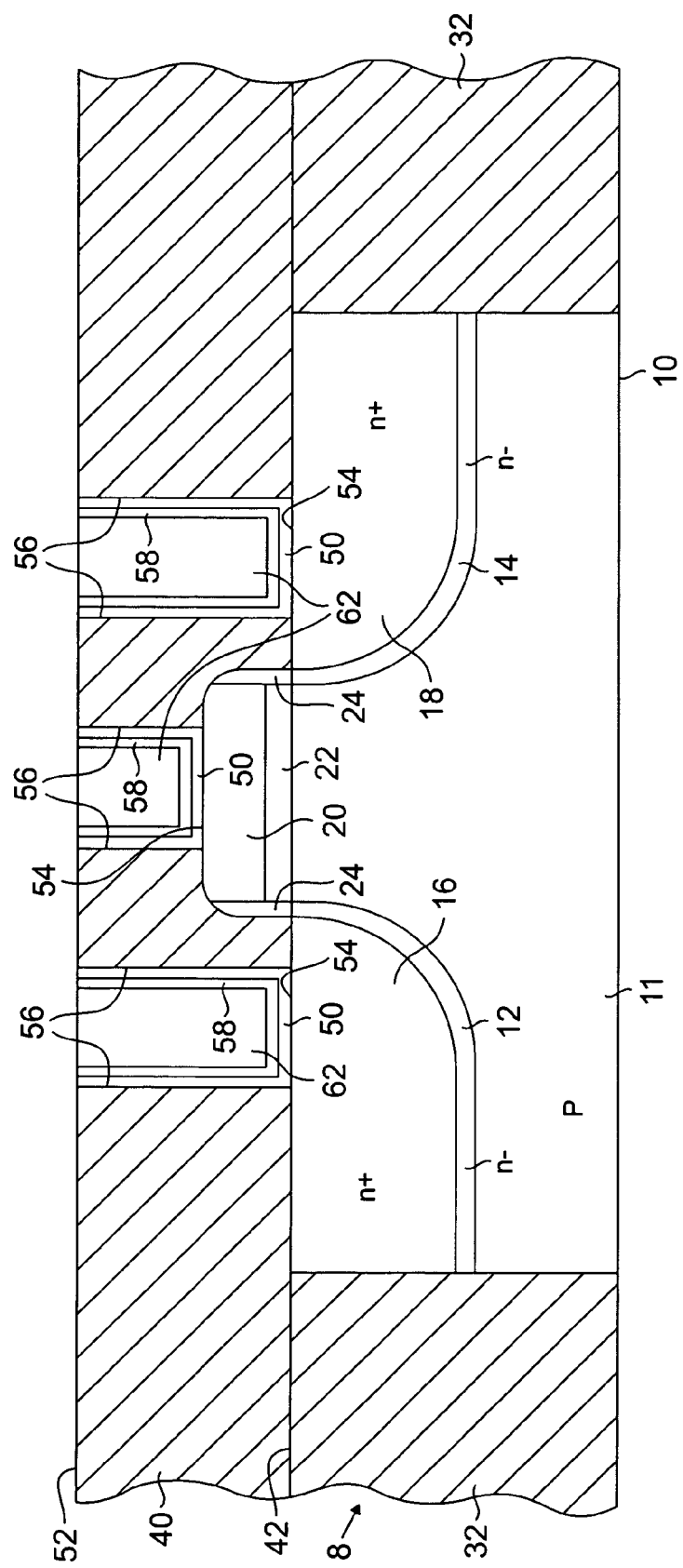
Figure 5:
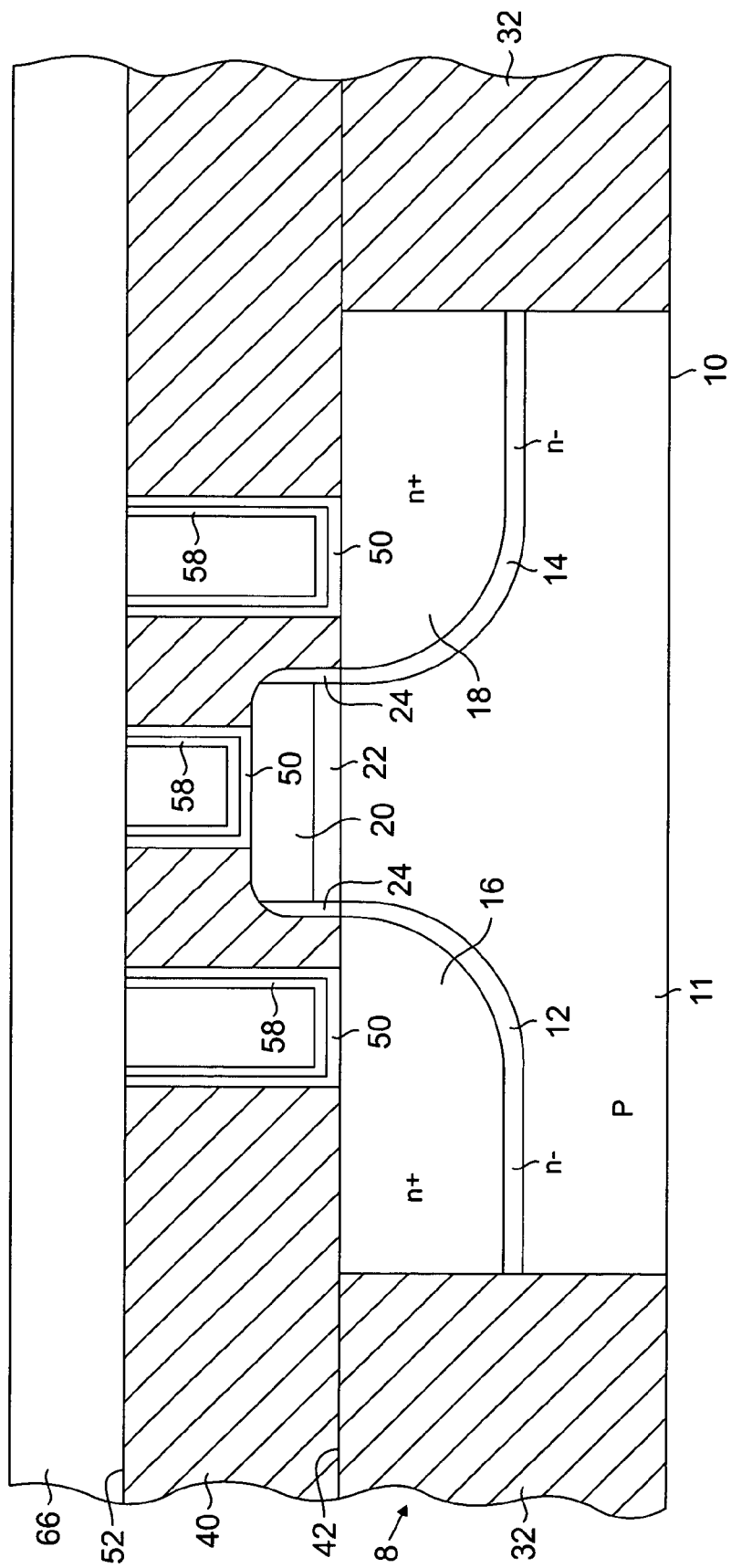
Figure 6:
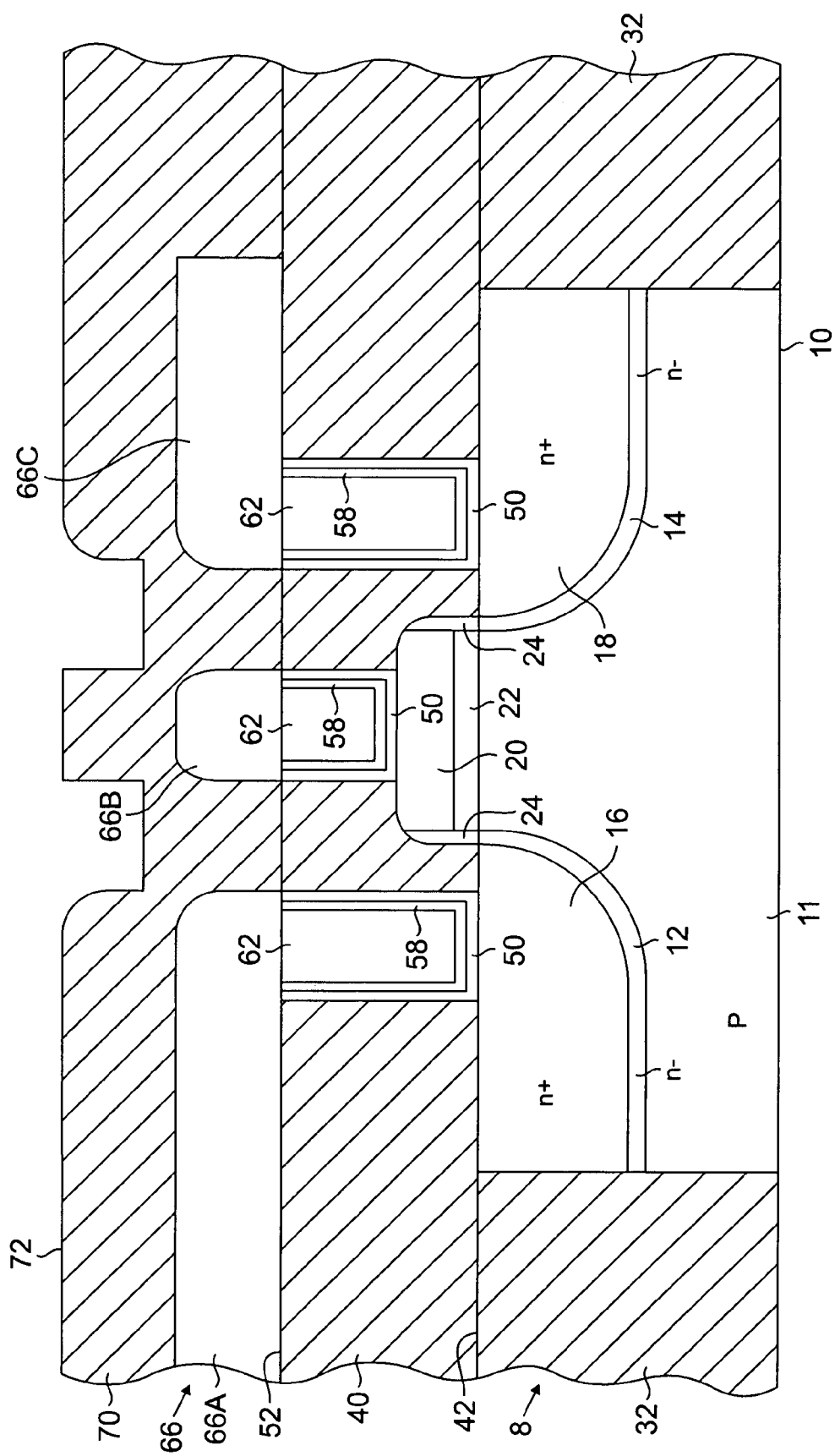
Figure 7:
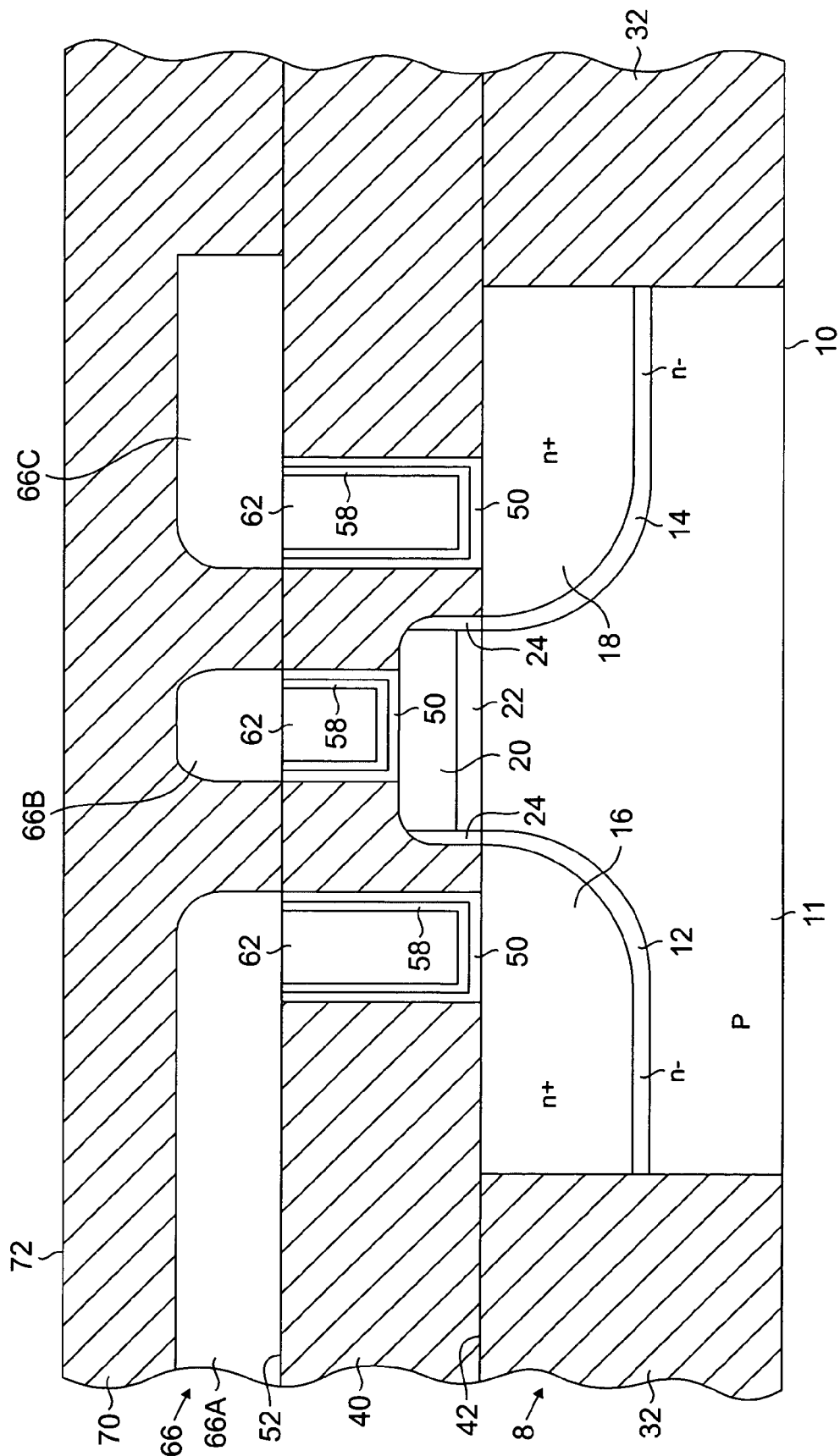
Figure 8:
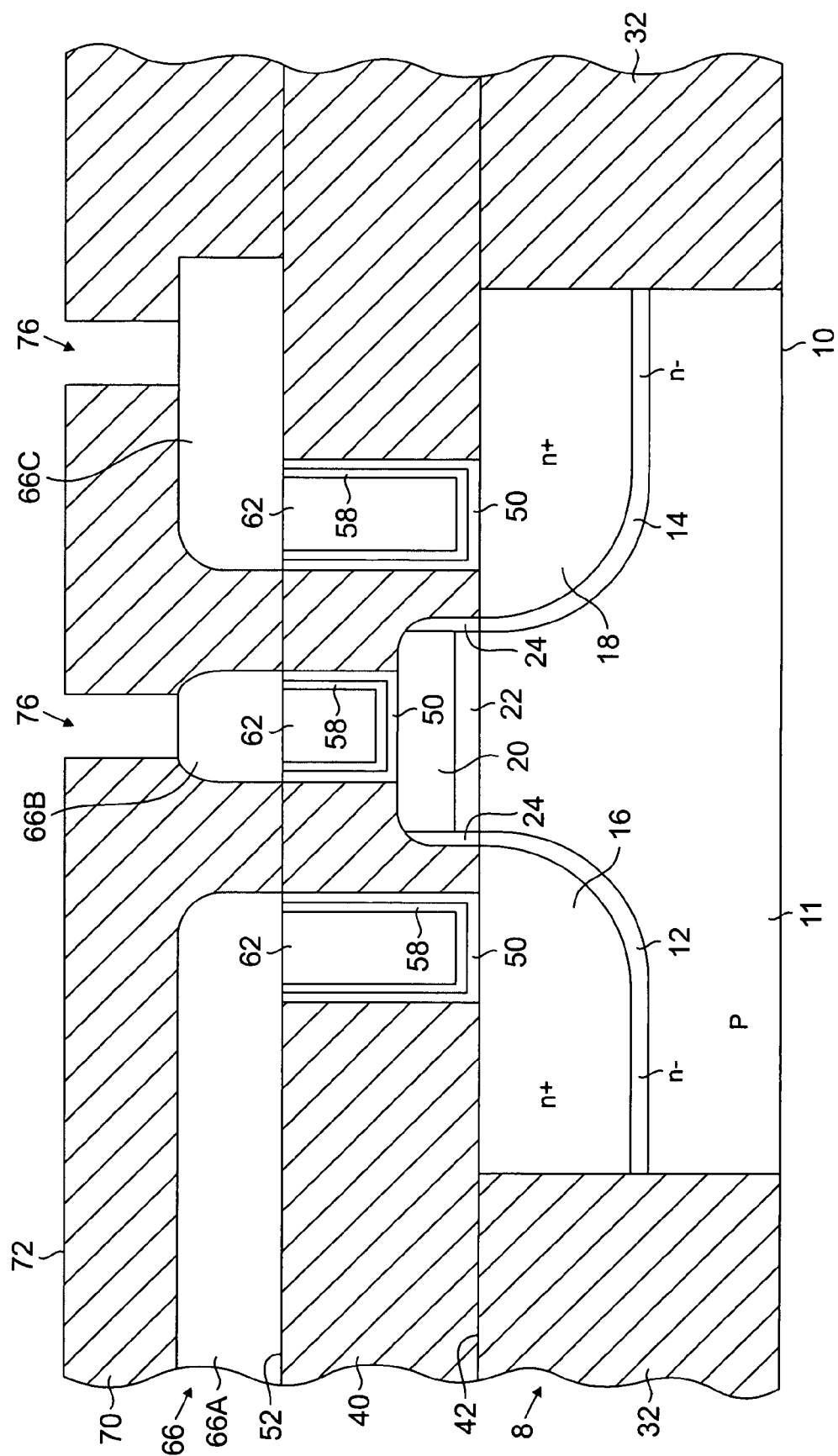
Figure 9:
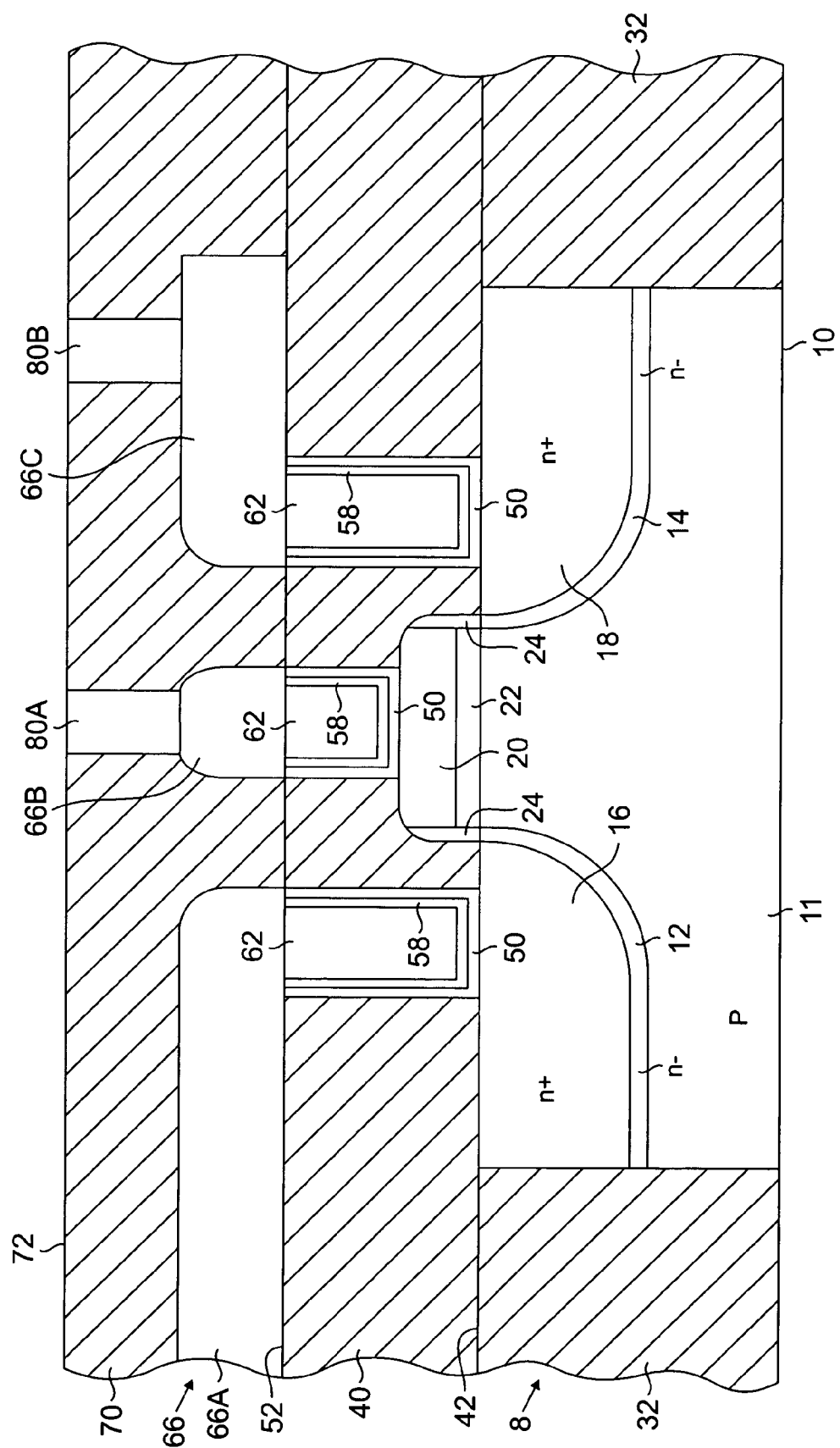
Figure 10:
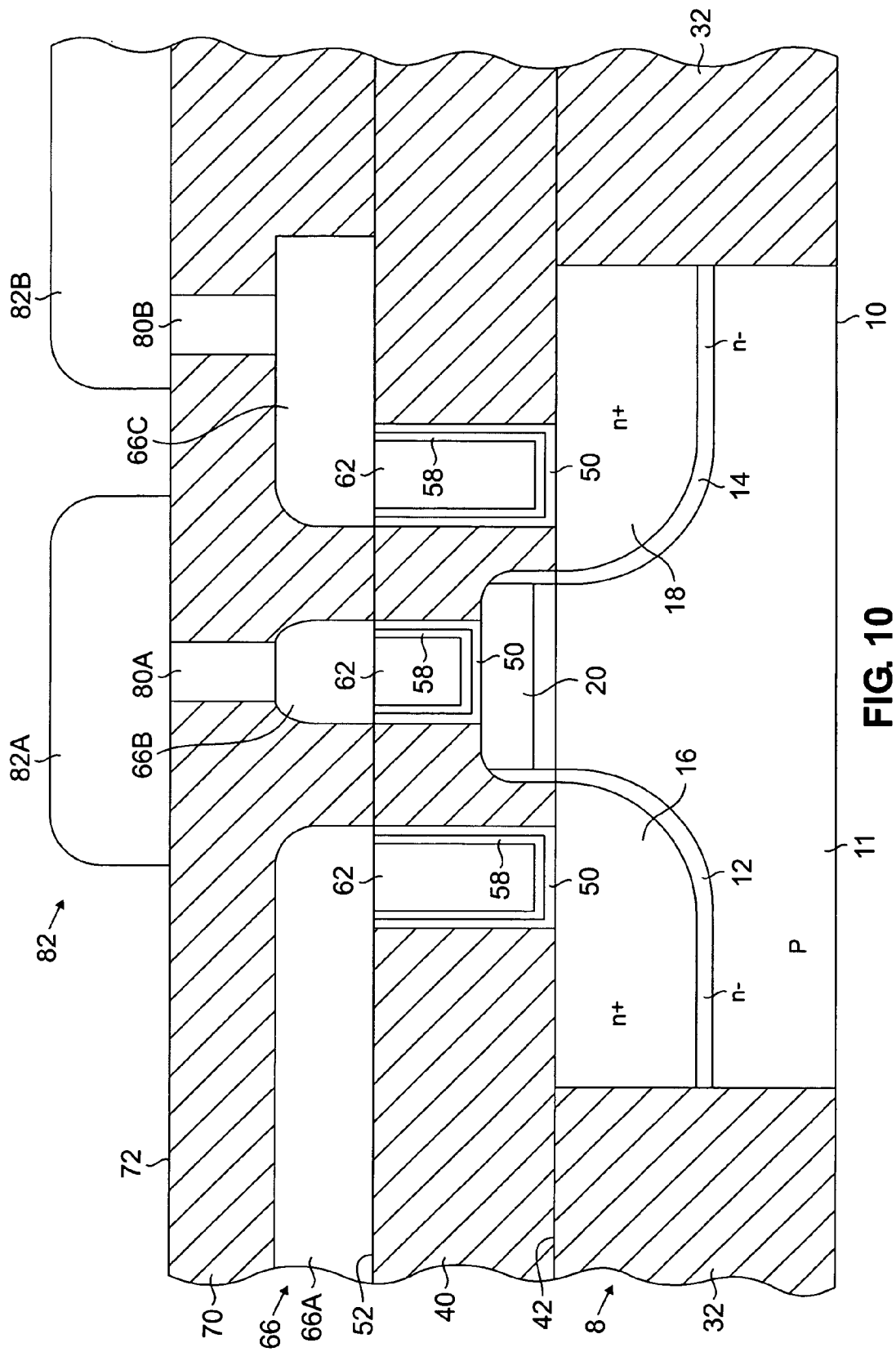
Figure 11:
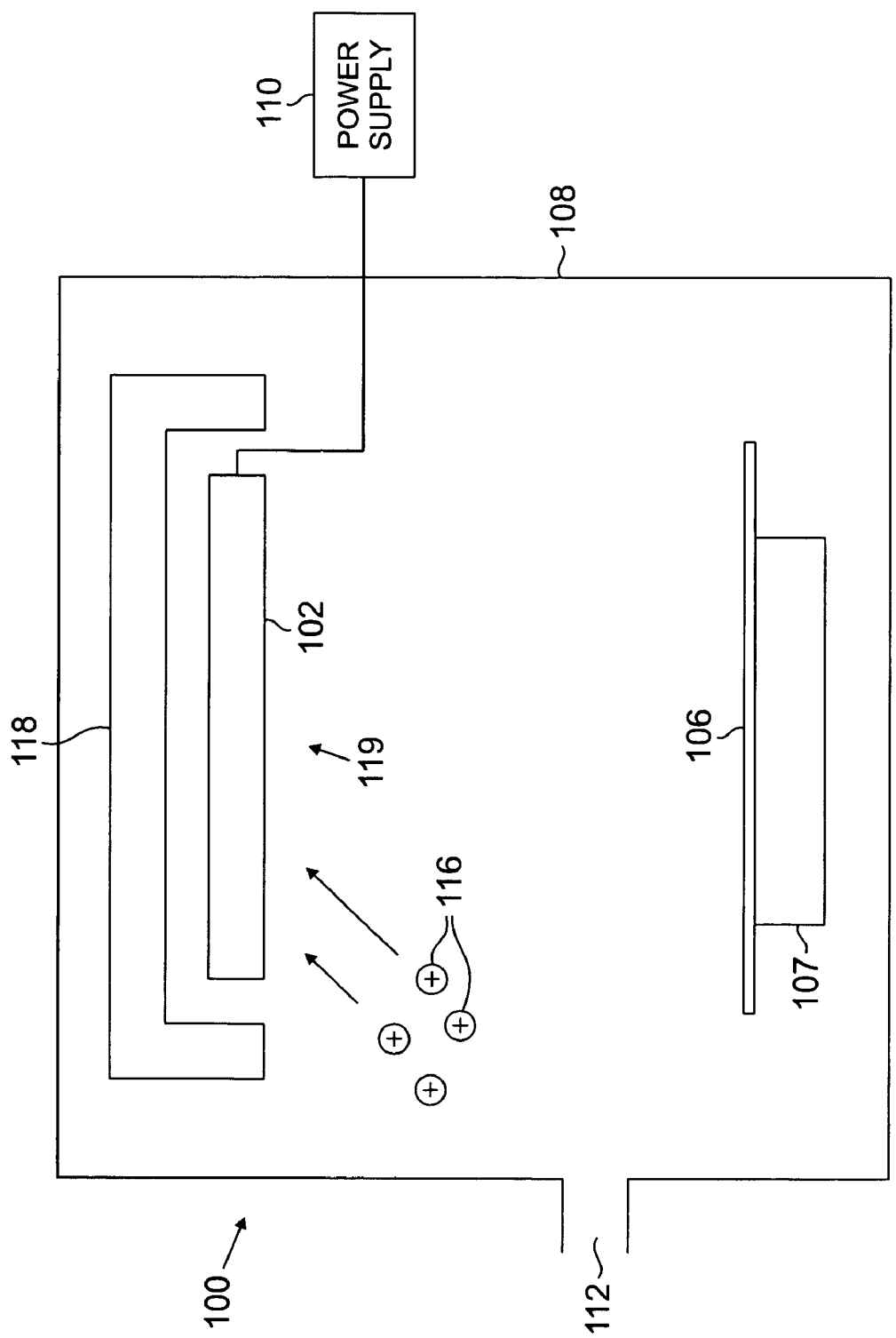
FIG. 11 is a schematic representation of a sputter chamber.

Before describing in detail the particular optimized sputtering process in accordance with the present invention, it should be observed that the present invention resides primarily in a novel and non-obvious combination of elements and process steps. Accordingly, the elements have been represented by conventional elements in the drawings, showing only those specific details that are pertinent to the present invention, so as not to obscure the disclosure with structural details that will be readily apparent to those skilled in the art having the benefit of the description herein.

Figure 12:
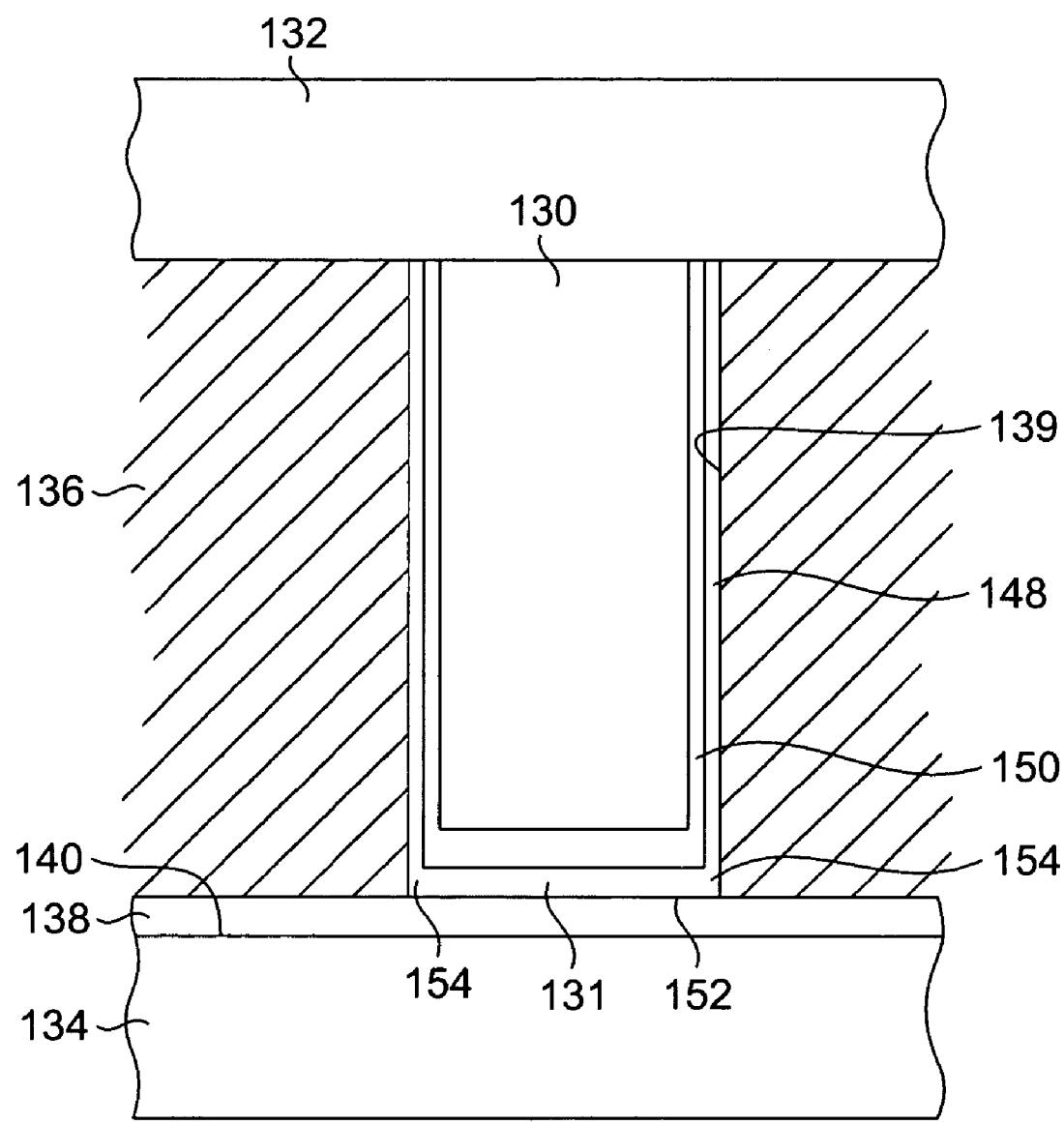
FIGS. 12 and 13 illustrate a tungsten plug formed within a semiconductor substrate.

FIG. 12 presents a detailed view of a tungsten plug 130, similar to the tungsten plugs 62, 80A and 80B described above. The tungsten plug 130 is formed within a window or via opening 131, for interconnecting overlying and underlying aluminum metallization layers 132 and 134, respectively, formed in a dielectric substrate 136. Conventionally, an antireflective cap layer 138 is formed over an upper surface 140 of the aluminum metallization layer 134. The high-reflectivity aluminum substantially degrades the quality of the photolithographic imaging process performed over the aluminum layer 134. The antireflective cap layer 138, typically comprising titanium nitride (TiN) is employed to reduce these reflections.

A titanium layer 148 serves as an adhesion layer between the anti-reflective cap layer 138 and the sidewalls 139 of the window or via opening 131, and the respective overlying layers as described below.

The tungsten plug 130 is formed by a chemical vapor deposition involving tungsten hexafluoride ($WF_6$) and silane ($SiH_4$). It is known that the fluorine is a highly reactive material that reacts with and contaminates the aluminum and the titanium unless a barrier layer is present. Thus a titanium nitride layer 150 is formed within the via opening 131, overlying the titanium layer 148, to barrier the tungsten hexafluoride from the underlying aluminum metallization layer 134 and the underlying titanium layer 148.

During the deposition of the titanium layer 148 and the titanium nitride layer 150, it is especially important for sufficient material to be deposited on a bottom surface 152 of the window or via opening 131, and at corners 154 between the bottom surface 152 and the sidewalls 139. However, the deposition process should be controlled to limit the thickness of the titanium layer 148 and the titanium nitride layer 150, as excessively thick layers can appreciably affect the conductivity between the underlying aluminum metallization layer 134 and the tungsten plug 130.

Figure 13:
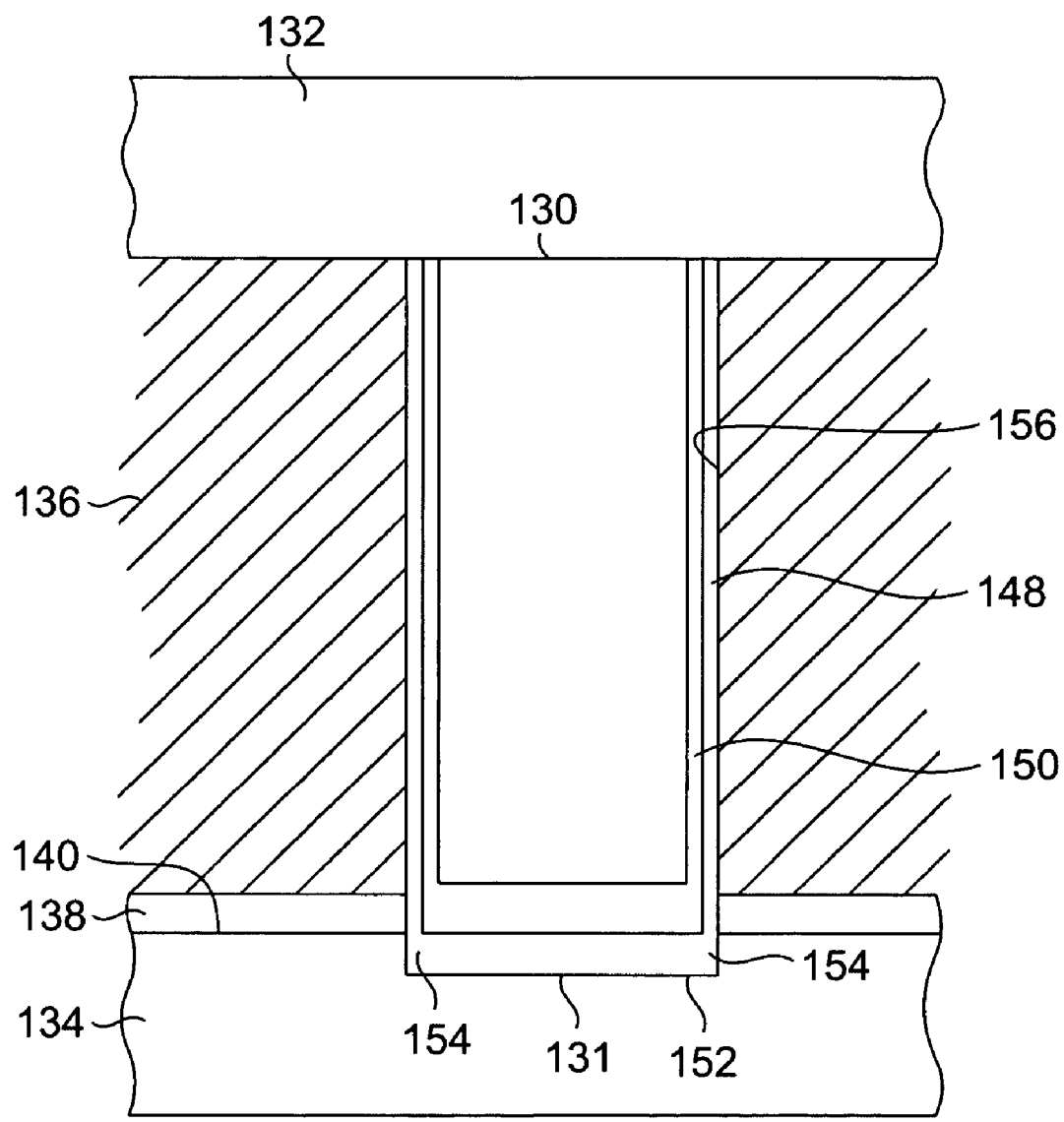

As is known by those skilled in the art, in another embodiment of the tungsten plug 130 of FIG. 12, etching of the dielectric substrate 136 to form the window or via opening 131 continues below the upper surface of the antireflective cap layer 138 and into an upper region of the aluminum metallization layer 134. Thus in this embodiment the tungsten plug 130, and its associated titanium layer 148 and titanium nitride layer 150, are recessed within the aluminum metallization layer 134. FIG. 13 illustrates this embodiment.

The aspect ratio of the via opening 131 and the tungsten plug 130 formed therein is defined as the ratio of the via opening depth to the via opening diameter. As the physical device size and active areas of an integrated circuit shrink, the aspect ratios within the device tend to increase. The typical via opening depth has not changed significantly with device shrinkage, as the distance between interconnect layers has remained fairly constant. However, decreasing device size has significantly reduced the via opening diameter, increasing the aspect ratio. While anisotropic etching using high-density plasma is now commonly practiced to form the high aspect ratio via openings, refilling these deep narrow openings with barrier layers and conductive metals can be a substantial technical challenge.

One PVD approach to depositing the barrier layers and conductive material in the high aspect ratio vias is referred to as ionized metal (IM) deposition or ionized metal plasma (IMP) sputtering. After the material is sputtered from the target and ionized, an electric field perpendicular to the wafer directs the ions to the wafer surface in a collimated beam. The collimated ions impinge the wafer surface over a fairly narrow angular range centered at 90° or perpendicular to the wafer surface, and thus improve the deposition coverage (i.e., the step coverage) along the bottom surface 152 and the corners 154 of the via opening 131, as compared with other PVD techniques. In high aspect ratio via openings the known PVD processes provide about 5% step coverage on the bottom surface of the via. The IMP process improves the bottom surface step coverage to about 50%.

Figure 14:
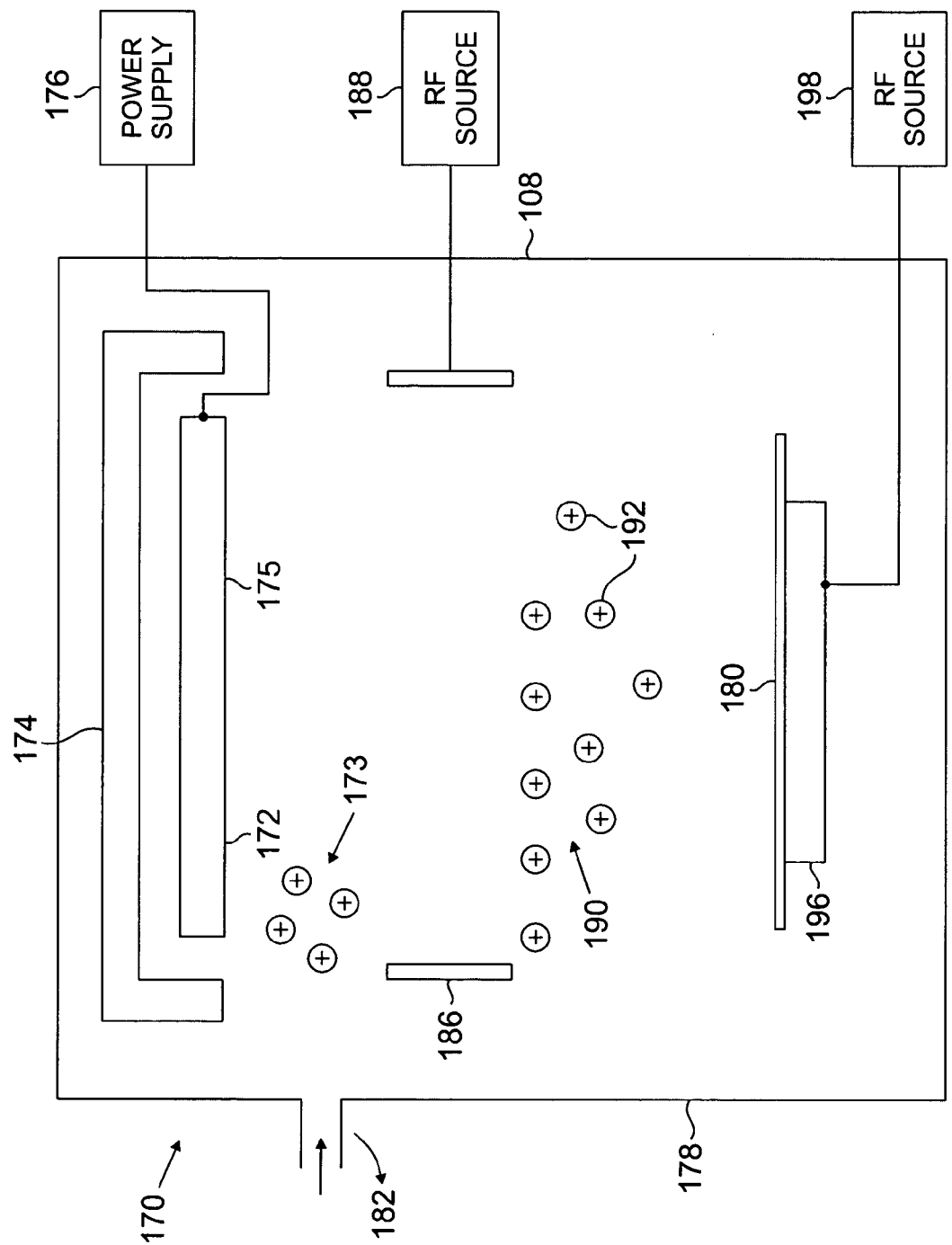
FIGS. 14 and 15 illustrate a sputter chamber to which the teachings of the present invention can be applied.

FIG. 14 illustrates an IMP reactor 170, including a target 172 and a permanent magnet 174 proximate the target 172. The target 172 is negatively biased (with respect to a chamber shield 173) in response to a DC power source 176 (typically supplying about 4 kW). The target 172 is formed from material to be sputtered onto a wafer 180 situated at the bottom of the reactor 170. Argon gas is introduced into the reactor 170 via an inlet port 182, and ionized (forming a plasma of argon ions 173) by the electric field formed between the target 172 and the chamber shield 178. The magnet 174 collimates the plasma of argon ions 173, confining argon ions 173 to a region proximate a surface 175 of the target 172. The positive argon ions 173 are attracted to the negatively-biased target 172 where the collisions with the target material cause target molecules to be knocked from the target 172. The flux or density of the scattered target material atoms is directly responsive to the DC power supplied to the target 172 by the power source 176.

A single-loop coil 186 within the reactor 170 is responsive to an RF source 188 providing radio frequency energy (at a sufficiently high frequency and power level to create a high ion efficiency plasma) for generating a high-density plasma in a central region 190 of the reactor 170. The electron density in the plasma is sufficient to ionize (i.e., strip away an electron) a large percentage (in one embodiment about 40% to 60%) of the atoms sputtered from the target 172, creating sputtered target ions 192 carrying a positive charge. The number of target atoms that are ionized by the plasma is responsive to the power delivered by the RF source 188. The sputtered target ions 192 are accelerated and collimated toward the surface of the wafer 180 by the plasma sheath, a region of an intense electric field immediately above the wafer 180, and by the application of the negative-going component (i.e., rectified) of a radio-frequency bias signal to a wafer chuck 196 from an radio frequency source 198. The velocity of the target ions 192 is directly responsive to the power supplied by the RF source 188.

Figure 15:
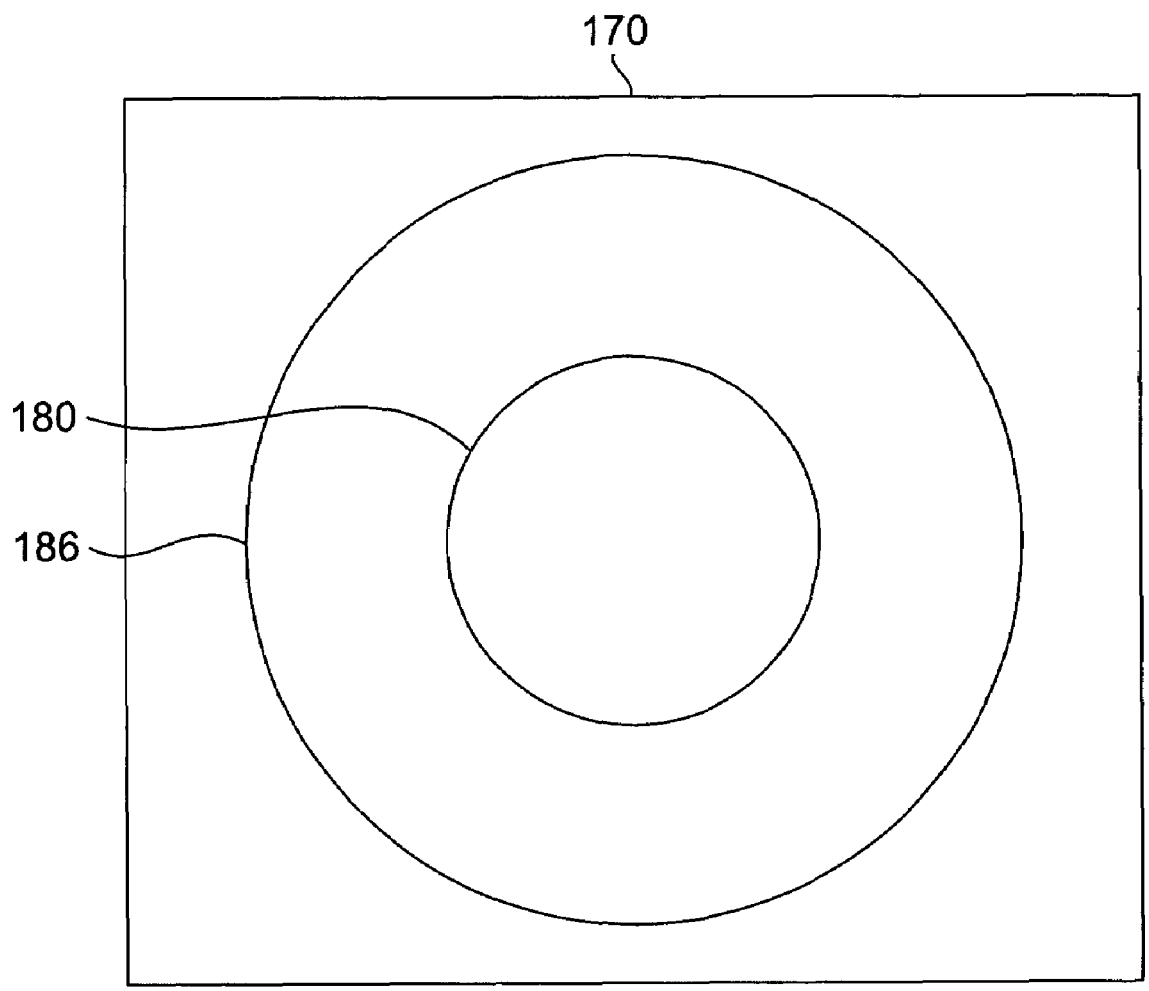

FIG. 15 is a top view of the chamber 170, showing the orientation of the wafer 180 and the single-loop coil 186.

The collimated beam of sputtered ions 192 produced in the IM process is distributed over an angular range relatively close to 90° (i.e., perpendicular to the wafer surface), whereas other sputtering processes that lack the plasma field in the region 190 and the wafer bias provided by the RF source 198 sputter material from the target in a trajectory of about 45° to 90°, with a Gaussian probability distribution. Material coverage in high aspect ratio openings over this angular range is generally poor. With a more limited range of angular trajectories, the IM process provides more conformal deposition in high aspect ratio openings. In particular the IM process offers more conformal coverage of the titanium layer 148 and the titanium-nitride layer 150 on the bottom surface 152 of the via opening 131, especially in the corners 154, as shown in FIG. 13.

In addition to sputtering the titanium layer 148 and the titanium-nitride layer 150, the IM process is also useful for depositing other sputtered materials during wafer processing, especially for depositing material in high aspect ratio features.

Figure 16A:
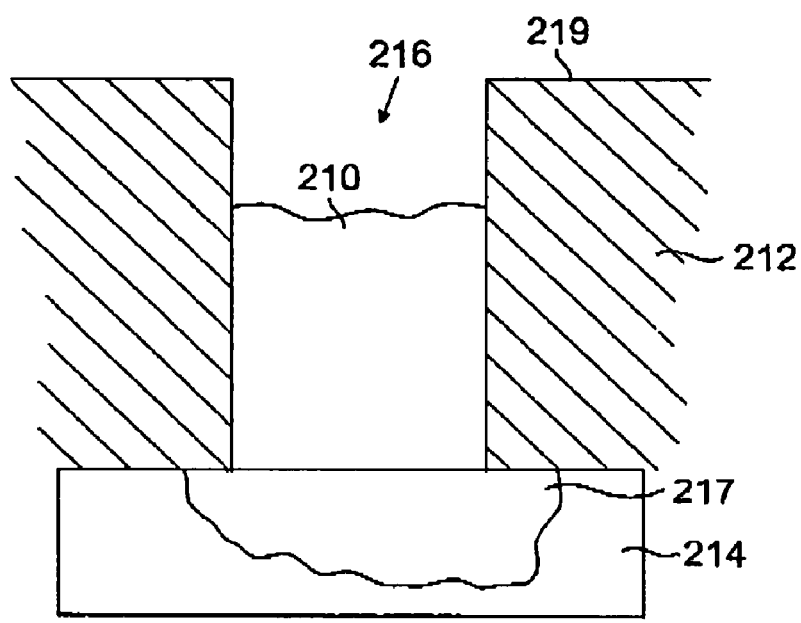
FIGS. 16A and 16B illustrate a via opening through which underlying aluminum has been extruded.
Figure 16B:
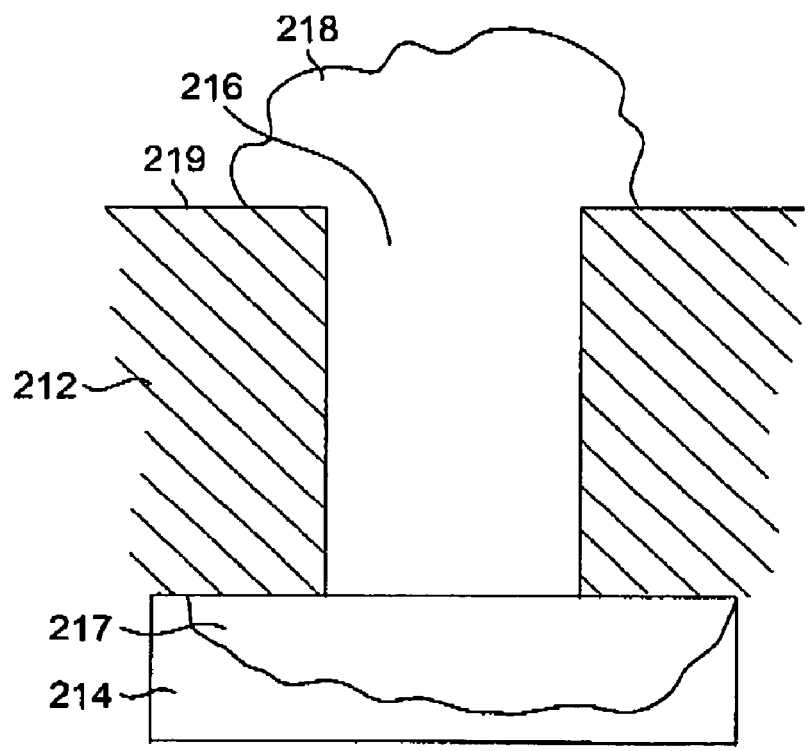

However, according to this prior art IM process, when a material, such as titanium or titanium-nitride, is being deposited in the via opening 131 with aluminum as an underlying material (e.g., the aluminum metallization layer 134) it has been observed that the aluminum extrudes upwardly within the via opening 131 during the deposition process. FIGS. 16A and 16B depict a via opening 210 in a dielectric substrate 212 and an underlying aluminum metallization layer 214. In FIG. 16A an aluminum mass 216 has begun to extrude upwardly in the via opening 210, leaving behind voids 217 in the aluminum metallization 214. In FIG. 16B the aluminum mass 216 has extruded out of the via opening 210 and formed a mass 218 on an upper surface 219 of the dielectric substrate 212.

The cause of the aluminum extrusion has been attributed to excessive temperatures within the aluminum metallization layer 214 due to the bombardment of the wafer by the sputtered ions being deposited, coupled with the stress forces imposed on the aluminum by the overlying material layers. Generally, at wafer temperatures of about 410° C. these extrusions have been observed as the aluminum transitions to a plastic deformation state then begins to extrude from the via opening 210.

To prevent the aluminum extrusion, during the deposition of titanium and titanium-nitride, for example, according to the teachings of the present invention, the DC power supplied to the target 172 is increased from about 4 kW to about 6 kW. The higher power produces a more intense electric field, increasing the velocity at which the argon ions strike the target 172. As a result, more target atoms are sputtered from the target 172 over a fixed time interval than are sputtered when the DC power source 176 is operated at the lower power level according to the prior art. That is, the density of the sputtered target material increases in response to an increase in the DC power supplied from the power source 176. The higher target material density accelerates the deposition rate of the target ions 192 on the wafer 180 when compared to the prior art IM process. With an increased deposition rate (about 50% faster in one embodiment), the deposition duration is decreased and thus the wafer temperature does not have sufficient time to reach the critical temperature at which the aluminum can begin to extrude. Operation of the DC power source 176 at the higher power level does not substantially affect the conformality or other properties of the deposited material. Although other process parameters can be varied to increase the target material deposition rate, it has been determined that the power supplied to the target 172 exhibits the greatest effect on the material deposition rate.

As described above, in an integrated circuit interconnect structure, aluminum interconnect layers are typically deposited over titanium and titanium nitride layers. The latter can be formed according to the teachings of the present invention to avoid extrusion of underlying aluminum layers. It has also been demonstrated that employing the process of the present invention to deposit the underlying titanium and titanium nitride layers increases the number of atoms in an overlying aluminum layer that are formed in a desired crystal orientation, thereby improving certain characteristics of the deposited aluminum.

Electromigration is a phenomenon in which the aluminum lead grows thinner and can eventually separate, creating an open circuit. The electric field and thermal heating generated by current flow through the conductor are generally believed to cause electromigration. It is known that increasing the number of aluminum atoms having a <111> crystal orientation reduces the likelihood of electromigration. Employing the teachings of the present invention to form the titanium and titanium nitride layers underlying an aluminum layer increases the percentage of atoms in the <111> orientation. In one embodiment the percentage increased from about 97% to about 98%, reducing electromigration effects.

Increasing the DC power as taught by the present invention is a counter-intuitive approach, as the prior art teaches lowering the DC power to lower the velocity of the impinging argon ions. Since the sputtering process involves a momentum transfer during a collision of the argon ions with the target material, the lower velocity impinging argon ions release lower velocity target atoms. Thus the sputtered target ions 192 have less energy as they strike the wafer 180, which in turn lowers the wafer temperature. The present invention teaches raising the DC power to increase the argon ion velocity, in turn increasing the target material density and accelerating the deposition rate.

The teachings of the present invention are also applicable to the deposition of materials other than titanium and titanium nitride employing an IM process. For example, the deposition of barrier and seed layers for damascene interconnects (including the use of both copper and aluminum as the interconnect metal) can be performed according to the teachings of the present invention. Also, a silicide process where metal (such as titanium, cobalt, tungsten, molybdenum, nickel or any refractory metals) is deposited to form intermetallic bonds with the underlying silicon can employ the process of the present invention. More generally, whenever it is desired to limit the temperature of the wafer during a PVD process, the teachings of the present invention can be employed.

A process has been described as useful for depositing material on a wafer, while the wafer is maintained at a temperature below a critical temperature. While specific applications and examples of the invention have been illustrated and discussed, the principals disclosed herein provide a basis for practicing the invention in a variety of ways and in a variety of circuit structures. Numerous variations are possible within the scope of the invention. The invention is limited only by the claims that follow.

What is claimed is:

1. A method for depositing a target material on a semiconductor wafer, wherein the wafer comprises a first material layer, an overlying second material layer and a plurality of openings in the second material layer extending to the first material layer, the method comprising:
   sputtering target material particles from a target;
   controlling power supplied to the target to maintain the wafer temperature below a critical temperature, wherein at a wafer temperature above the critical temperature the material of the first material layer can extrude into one or more of the plurality of openings; and
   depositing the target material particles on the wafer.

2. The method of claim 1 wherein the step of controlling power supplied to the target further comprises increasing the power supplied to the target to increase a deposition rate of target material particles on the wafer above a deposition rate at which the first material layer can extrude into one or more of the plurality of openings.

3. The method of claim 1 wherein the material comprising the target is selected from between titanium and tantalum.

4. The method of claim 1 wherein one or more of the plurality of openings comprise high aspect ratio openings.

5. A method for depositing a target material on a semiconductor wafer, wherein the wafer comprises a first material layer, an overlying second material layer and a plurality of openings in the second material layer extending to the first material layer, the method comprising:
   providing a target comprising the target material;
   supplying power to the target to maintain the wafer temperature below a critical temperature, wherein at a wafer temperature above the critical temperature the material of the first material layer can extrude into the plurality of openings;
   positioning the wafer below the target;
   sputtering target material particles in response to impinging particles directed toward the target;
   forming a plasma of ionized target material particles from the sputtered target material particles between the target and the wafer;
   supplying power to the wafer to attract the ionized target material particles to the wafer; and
   depositing the ionized target material particles on the wafer.

6. The method of claim 5 wherein the step of supplying power to the target further comprises increasing the power supplied to the target to increase a deposition rate of ionized target material particles on the wafer, above a deposition rate at which the first material layer can extrude into the plurality of openings.

7. The method of claim 5 wherein the step of supplying power to the target further comprises increasing the power supplied to the target to increase a density of the impinging particles.

8. The method of claim 5 wherein the material comprising the target is selected from between titanium and tantalum.

9. The method of claim 5 wherein the particles impinging the target comprise argon ions.

10. The method of claim 9 wherein the step of supplying power to the target further comprises increasing the power supplied to the target to increase a velocity of the argon ions.

11. The method of claim 9 wherein the step of supplying power to the target further comprises increasing the power supplied to the target to increase a density of the argon ions.

12. The method of claim 9 further comprising forming a magnetic field to confine the argon ions in a region proximate the target.

13. The method of claim 5 wherein the step of forming the plasma further comprises providing radio frequency power to a coil positioned between the target and the wafer, and wherein the target material particles pass through the coil.

14. The method of claim 13 further comprising increasing the radio frequency power to increase a number of ionized target material particles.

15. The method of claim 5 wherein the material is deposited on a bottom surface of the plurality of openings.

16. The method of claim 5 wherein one or more of the plurality of openings comprise high aspect ratio openings.

17. The method of claim 5 wherein the step of supplying power to the target further comprises supplying power to the target to increase an intensity of an electric field formed by the power supplied to the target.

18. The method of claim 5 wherein the step of supplying power to the wafer farther comprises supplying radio frequency power to the wafer.

19. A method for controlling a physical vapor deposition process for depositing material from a target onto a semiconductor wafer comprising a plurality of features and positioned below the target, the method comprising:
   forming an electric field in a region of the target by controlling power supplied to the target;
   directing particles toward the target;
   sputtering target material from the target in response to the particles;
   forming a plasma between the target and the wafer, wherein the sputtered target material is ionized by the plasma to form ionized target material;
   supplying radio frequency power to the wafer for attracting the ionized target material to the wafer;
   depositing the ionized target material on the wafer; and
   controlling the electric field to maintain the wafer temperature below a critical temperature, above which wafer features can sustain damage.

20. The method of claim 19 wherein the step of forming the electric field further comprises controlling the electric field to increase the velocity of the particles directed toward the target to effect an increase in an amount of sputtered target material.

21. The method of claim 19 wherein the step of directing particles further comprises introducing argon molecules, ionizing the argon molecules to form a plasma of argon ions in a region of the target, and attracting the argon plasma to the target.

22. The method of claim 19 wherein the step of forming the electric field further comprises controlling the electric field to increase an amount of sputtered target material.

23. The method of claim 19 wherein the step of forming the electric field further comprises controlling the electric field to increase a rate at which ionized target material is deposited on the wafer.

24. The method of claim 19 wherein the step of forming the electric field further comprises controlling the electric field to reduce the wafer temperature during the step of depositing the ionized target material on the wafer.

25. An apparatus for depositing material on a substrate having a plurality of openings formed therein, the apparatus comprising:
   a target formed from the material to be deposited on the substrate;
   a source of impinging particles directed toward the target, wherein target material is released from the target in response to the impinging particles, wherein the released target material is deposited on the substrate;
   a controllable power source connected to the target, wherein the power delivered by the power source is controlled to maintain the wafer temperature below a critical temperature during the deposition process; and
   a wafer chuck for supporting the wafer during the deposition process.

26. The apparatus of claim 25 wherein the power delivered by the power source is controlled to increase the deposition rate of target material on the substrate.

27. The apparatus of claim 25 wherein the target material comprises titanium or tantalum.

28. The apparatus of claim 25 wherein one or more of the plurality of openings comprise high aspect ratio openings.

29. The apparatus of claim 25 further comprising a coil disposed between the wafer chuck and the target for forming a target material plasma and a radio frequency power source connected to the coil, wherein the target material plasma is formed as the target material passes through the coil.

30. The apparatus of claim 29 further comprising a power source for biasing the wafer to attract the target material plasma to the wafer.

* * * * *